United States Patent
Campbell et al.

(10) Patent No.: US 8,713,957 B2
(45) Date of Patent: May 6, 2014

(54) THERMOELECTRIC-ENHANCED, VAPOR-CONDENSER FACILITATING IMMERSION-COOLING OF ELECTRONIC COMPONENT(S)

(71) Applicant: International Business Machines Corporation, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/692,215

(22) Filed: Dec. 3, 2012

(65) Prior Publication Data
US 2013/0091868 A1    Apr. 18, 2013

Related U.S. Application Data

(63) Continuation of application No. 13/271,275, filed on Oct. 12, 2011.

(51) Int. Cl.
F25D 23/12 (2006.01)

(52) U.S. Cl.
USPC ............................................. 62/259.2; 62/3.2

(58) Field of Classification Search
USPC .............. 62/3.2, 259.2; 165/104.33; 361/699, 361/709
See application file for complete search history.

(56) References Cited

U.S. PATENT DOCUMENTS

| | | | |
|---|---|---|---|
| 4,792,059 A * | 12/1988 | Kerner et al. | 222/67 |
| 5,269,146 A | 12/1993 | Kerner | |
| 6,557,354 B1 | 5/2003 | Chu et al. | |
| 6,567,262 B2 | 5/2003 | Meir | |
| 7,403,384 B2 | 7/2008 | Pflueger | |

(Continued)

OTHER PUBLICATIONS

Seely, J.H., "Cooling System", IBM Technical Disclosure Bulletin, IPCOM000089944D, Mar. 5, 2005.

(Continued)

Primary Examiner — Melvin Jones
(74) Attorney, Agent, or Firm — Dennis Jung, Esq.; Kevin P. Radigan, Esq.; Heslin Rothenberg Farley & Mesiti P.C.

(57) ABSTRACT

Cooling methods are provided for immersion-cooling one or more electronic components. The cooling method includes: providing a housing at least partially surrounding and forming a fluid-tight compartment about the electronic component(s) and a dielectric fluid disposed within the fluid-tight compartment, with the electronic component(s) immersed within the dielectric fluid; and providing a vapor-condenser, heat sink, and thermal conductive path. The vapor-condenser includes a plurality of thermally conductive condenser fins extending within the fluid-tight compartment, and the heat sink includes a first region and a second region, with the first region of the heat sink being in thermal contact with the vapor-condenser. The thermal conduction path couples the fluid-tight compartment and the second region of the heat sink in thermal contact, and includes a thermoelectric array, which facilitates transfer of heat from the fluid-tight compartment to the second region of the heat sink through the thermal conduction path.

20 Claims, 15 Drawing Sheets

(56) References Cited

U.S. PATENT DOCUMENTS

| | | |
|---|---|---|
| 7,817,423 B2 | 10/2010 | Moorehead |
| 7,885,070 B2 | 2/2011 | Campbell et al. |
| 7,916,483 B2 | 3/2011 | Campbell et al. |
| 7,944,694 B2 | 5/2011 | Campbell et al. |
| 7,961,475 B2 | 6/2011 | Campbell et al. |
| 7,983,040 B2 | 7/2011 | Campbell et al. |
| 8,179,677 B2 | 5/2012 | Campbell et al. |
| 8,184,436 B2 | 5/2012 | Campbell et al. |
| 2008/0186670 A1 | 8/2008 | Lyon et al. |
| 2009/0156114 A1* | 6/2009 | Ahladas et al. ............ 454/184 |
| 2011/0096504 A1 | 4/2011 | Hild |
| 2011/0103019 A1 | 5/2011 | Campbell et al. |
| 2011/0315343 A1 | 12/2011 | Campbell et al. |
| 2011/0315344 A1 | 12/2011 | Campbell et al. |
| 2011/0315353 A1 | 12/2011 | Campbell et al. |
| 2012/0024501 A1 | 2/2012 | Campbell et al. |
| 2013/0091866 A1 | 4/2013 | Campbell et al. |

OTHER PUBLICATIONS

Bar-Cohen, A., "Thermal Management of On-Chip Hot Spots and 3D Chip Stacks", Microwaves, Communications, Antennas and Electronics Systems, COMCAS, IEEE International Conference on Digital Object Identifier (2009).

Campbell et al. "Thermoelectric-Enhanced, Vapor-Condenser Facilitating Immersion-Cooling of Electronic Component(s)", U.S. Appl. No. 13/271,275, filed Oct. 12, 2011.

Campbell et al., Notice of Allowance for U.S. Appl. No. 13/271,275, filed Oct. 12, 2011 (U.S. Patent Publication No. 2013/0091866 A1), dated Jul. 10, 2013 (12 pgs.).

* cited by examiner

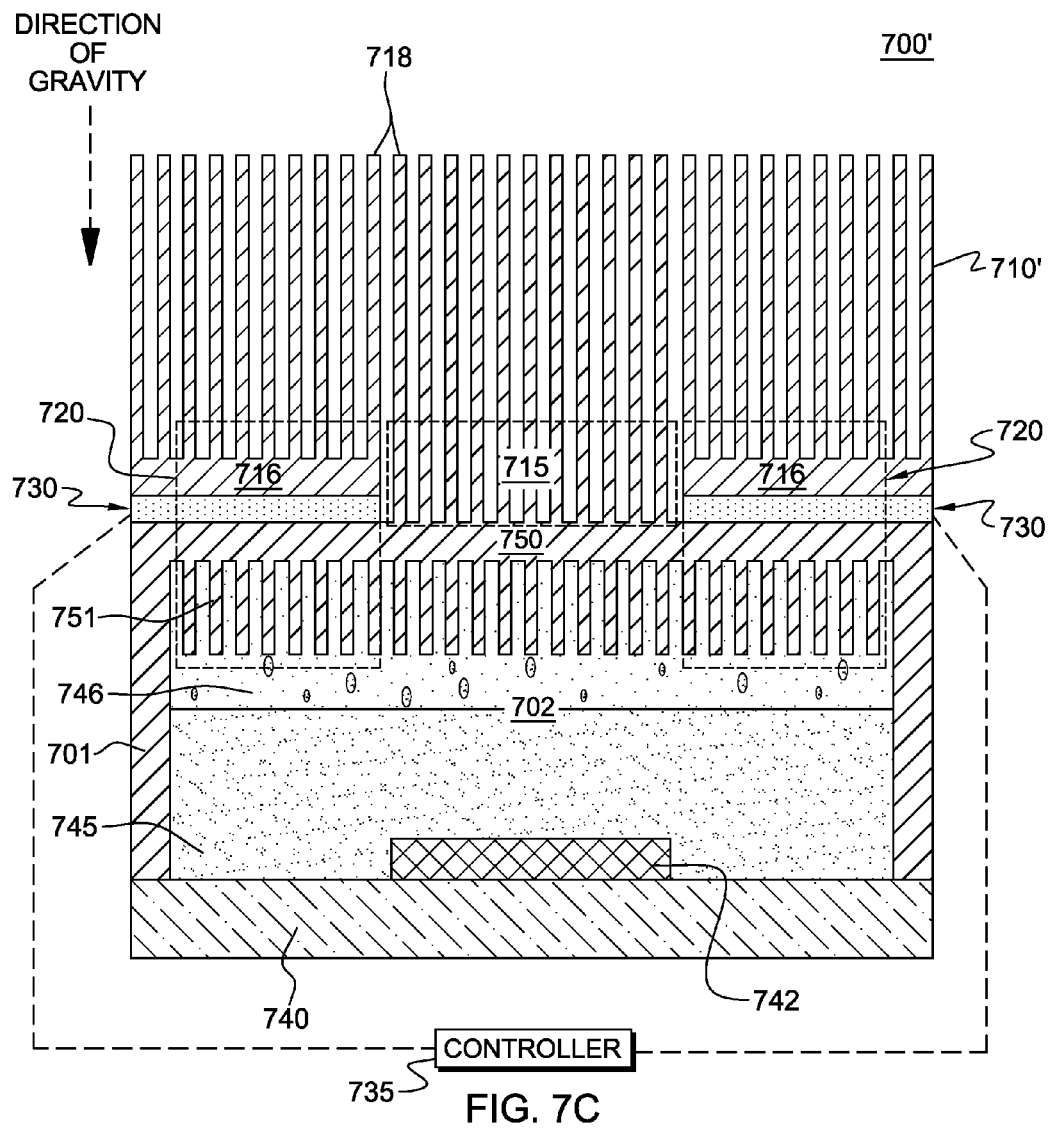

THERMOELECTRIC-ENHANCED, VAPOR-CONDENSER FACILITATING IMMERSION-COOLING OF ELECTRONIC COMPONENT(S)

CROSS-REFERENCE TO RELATED APPLICATION

This application is a continuation of U.S. Ser. No. 13/271,275, entitled "Thermoelectric-Enhanced, Vapor-Condenser Facilitating Immersion-Cooling of Electronic Component(s)," filed Oct. 12, 2011, and which is hereby incorporated herein by reference in its entirety.

BACKGROUND

The power dissipation of integrated circuit chips, and the modules containing the chips, continues to increase in order to achieve increases in processor performance. This trend poses cooling challenges at the module, subsystem and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided through the provision of a method of facilitating cooling of at least one electronic component is provided. The method includes: providing a housing at least partially surrounding and forming a fluid-tight compartment about the at least one electronic component to be cooled; immersing the at least one electronic component within a dielectric fluid within the fluid-tight compartment; providing a vapor-condenser comprising a plurality of thermally conductive condenser fins extending into the fluid-tight compartment; providing a heat sink comprising a first region and a second region, the first region of the heat sink being in thermal contact with the vapor-condenser; and providing a thermal conduction path coupling the fluid-tight compartment and the second region of the heat sink in thermal contact, the thermal conduction path comprising a thermoelectric array including at least one thermoelectric module, the thermoelectric array facilitating controlled transfer of heat from the fluid-tight compartment to the second region of the heat sink through the thermal conduction path.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7C is a partial cross-sectional elevational view of an alternate embodiment of an immersion-cooled electronic subsystem (or component), in accordance with one or more aspects of the present invention;

DETAILED DESCRIPTION

Figure 1:
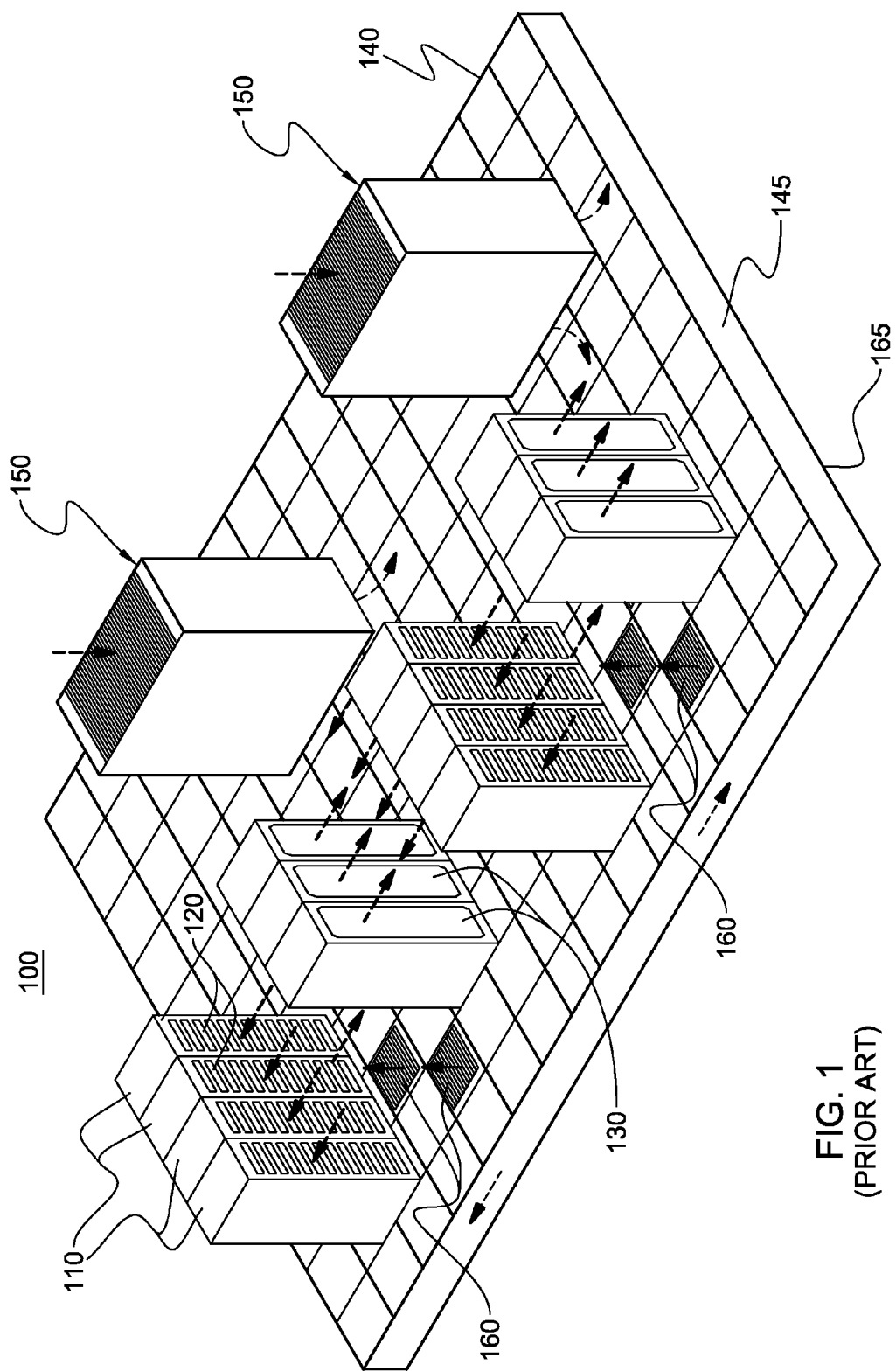
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise one or more electronic subsystems. "Electronic subsystem" refers to any sub-housing, blade, book, drawer, node, compartment, board, etc., having one or more heat-generating electronic components disposed therein or thereon. An electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system which comprises multiple different types of electronic components, and may be, in one example, a server unit.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled base plate", or "liquid-cooled structure" each refer to any conventional thermally conductive structure having a plurality of channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
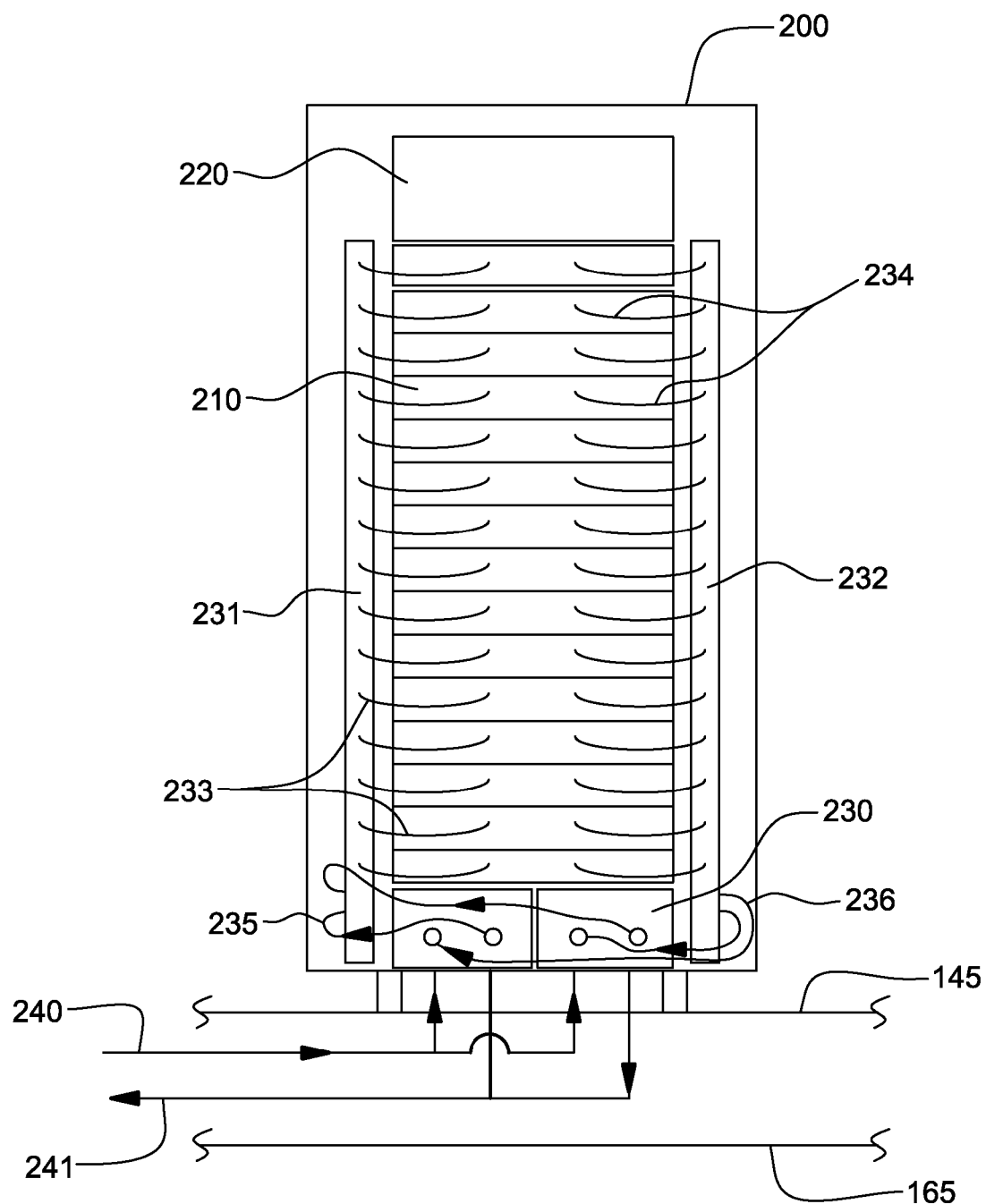
FIG. 2 is a front elevational view of one embodiment of a liquid-cooled electronics rack comprising multiple electronic subsystems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic subsystems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic subsystems. In the embodiments described herein, the system coolant is assumed to be water or an aqueous-based solution, by way of example only.

In addition to MCUs 230, the cooling apparatus includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (see FIGS. 6A-7A & 7D-9) disposed within the subsystems) and node-to-manifold fluid connect hoses 234 coupling the individual electronic subsystems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic subsystems is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
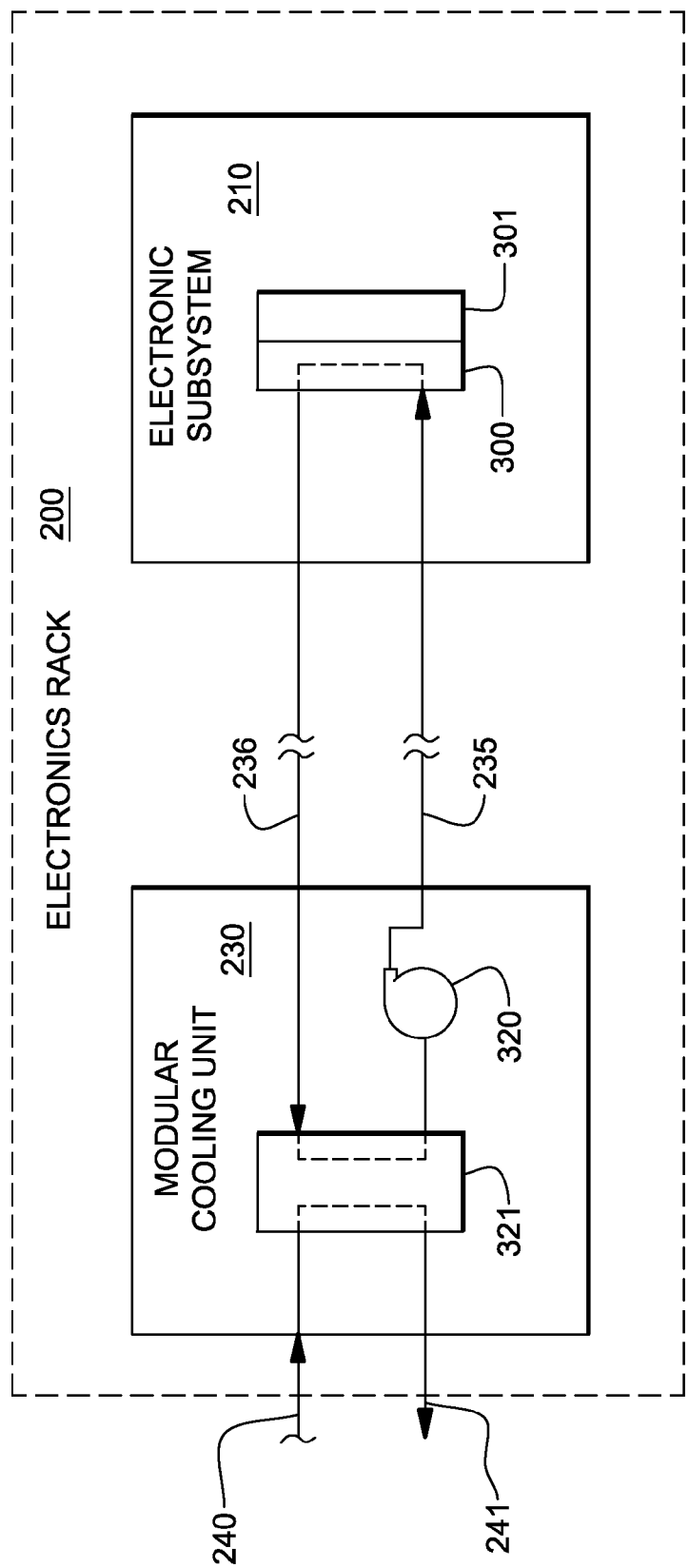
FIG. 3 is a schematic of an electronic subsystem of an electronics rack and one approach to liquid-cooling of an electronic component with the electronic subsystem, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic subsystem 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic subsystems. Furthermore, the system coolant is physically separate from the less controlled facility coolant in lines 240, 241, to which heat is ultimately transferred.

Figure 4:
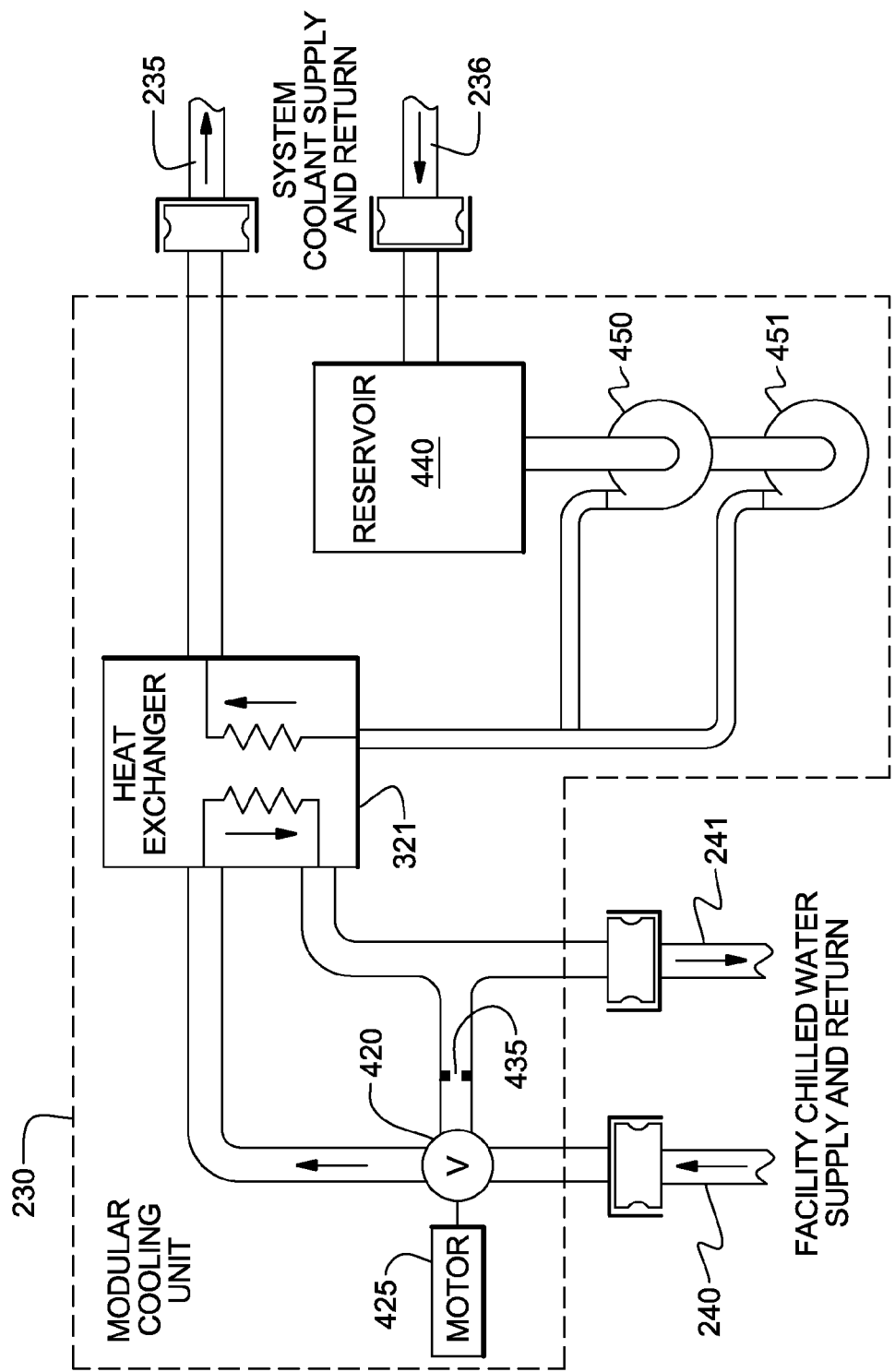
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
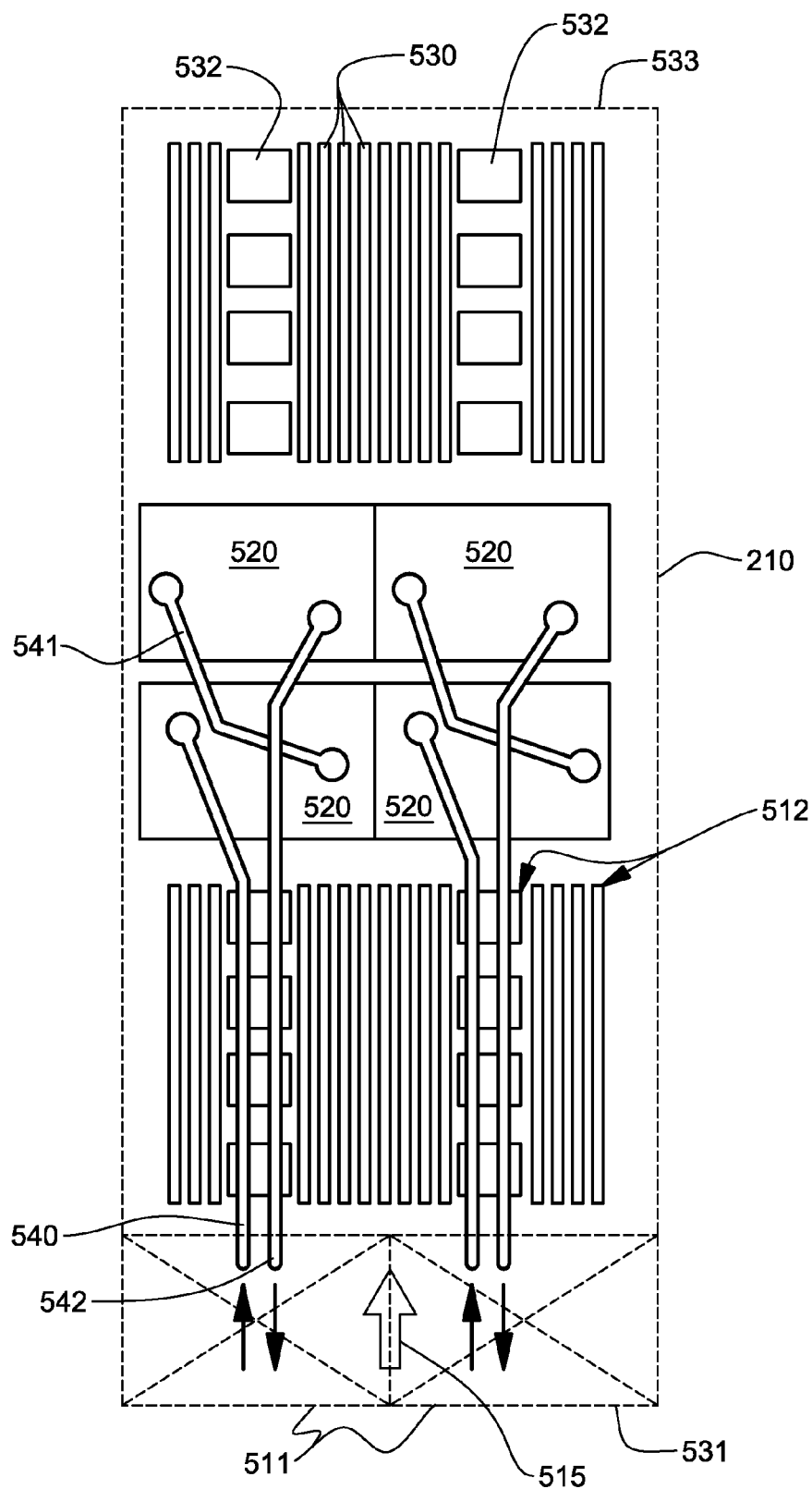
FIG. 5 is a plan view of one embodiment of an electronic subsystem layout illustrating an air and liquid-cooling approach for cooling electronic components of the electronic subsystem, in accordance with one or more aspects of the present invention.

FIG. 5 depicts another cooling approach, illustrating one embodiment of an electronic subsystem 210 component layout wherein one or more air moving devices 511 provide forced air flow 515 in normal operating mode to cool multiple electronic components 512 within electronic subsystem 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic subsystem 210, and partially arrayed near back 533 of electronic subsystem 210. Also, in the embodiment of FIG. 5, memory modules 530 and the memory support modules 532 are cooled by air flow 515 across the electronics subsystem.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As packaging density of modern electronics increases, heat dissipation for servers and server components becomes increasingly challenging. Electronic components must be cooled to function properly, and the service life of these components increases with lower temperature operation. New technologies, such as stacked die (3D modules) and solid state drives (SSDs) significantly increase the number of components and circuits, and thus the volumetric heat generation within electronics racks, servers, personal computers, and hand-held devices, such as smart phones. The structures disclosed herein address this increased volumetric dissipation of heat, while maintaining reliability through novel cooling arrangements.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic subsystem using pumped liquid, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, all components to be cooled are immersed in a dielectric fluid that dissipates heat through boiling. The vapor is then condensed by a secondary, rack-level working fluid using node or module-level, finned condensers, as explained below. A secondary fluid can then tolerate a larger temperature rise, thus requiring a smaller flow rate and/or higher inlet temperatures, improving energy efficiency.

Direct immersion-cooling of electronic components of an electronic subsystem of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 3 & 5, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic subsystems of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
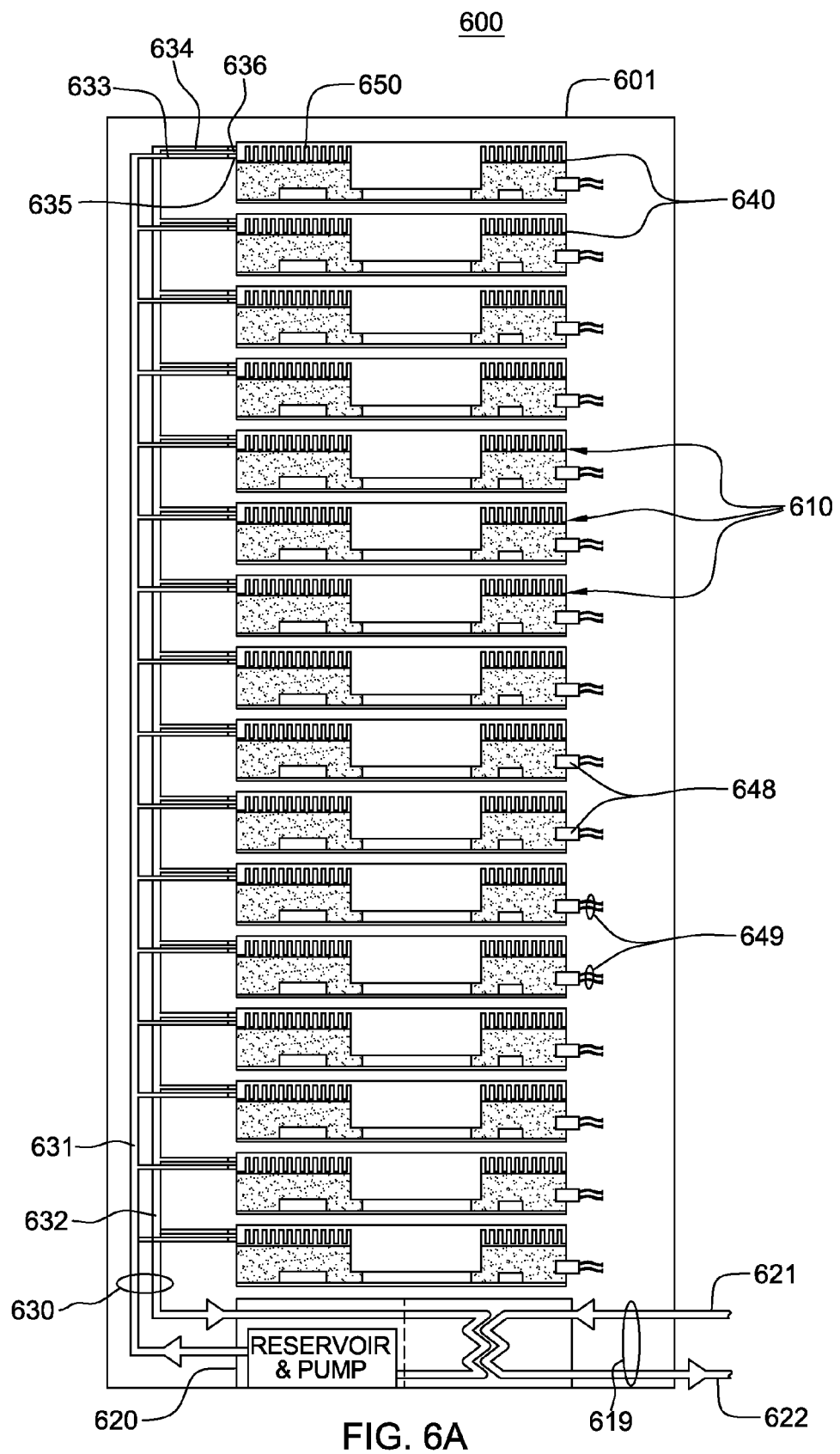
FIG. 6A is an elevational view of an alternate embodiment of a liquid-cooled electronics rack with immersion-cooling of electronic subsystems thereof, in accordance with one or more aspects of the present invention.

FIG. 6A is a schematic of one embodiment of a liquid-cooled electronics rack, generally denoted 600, employing immersion-cooling of electronic subsystems, in accordance with an aspect of the present invention. As shown, liquid-cooled electronics rack 600 includes an electronics rack 601 containing a plurality of electronic subsystems 610 disposed, in the illustrated embodiment, horizontally so as to be stacked within the rack. By way of example, each electronic subsystem 610 may be a server unit of a rack-mounted plurality of server units. In addition, each electronic subsystem includes multiple electronic components to be cooled, which in one embodiment, comprise multiple different types of electronic components having different heights and/or shapes within the electronic subsystem.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic subsystems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic subsystem 610 via the respective liquid-cooled vapor condenser 650 is transferred from the system coolant via the coolant outlet manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic subsystem disposed within the sealed housing when the electronic subsystem is operatively positioned within the sealed housing and the sealed housing is operatively positioned within the electronics rack.

Figure 6B:
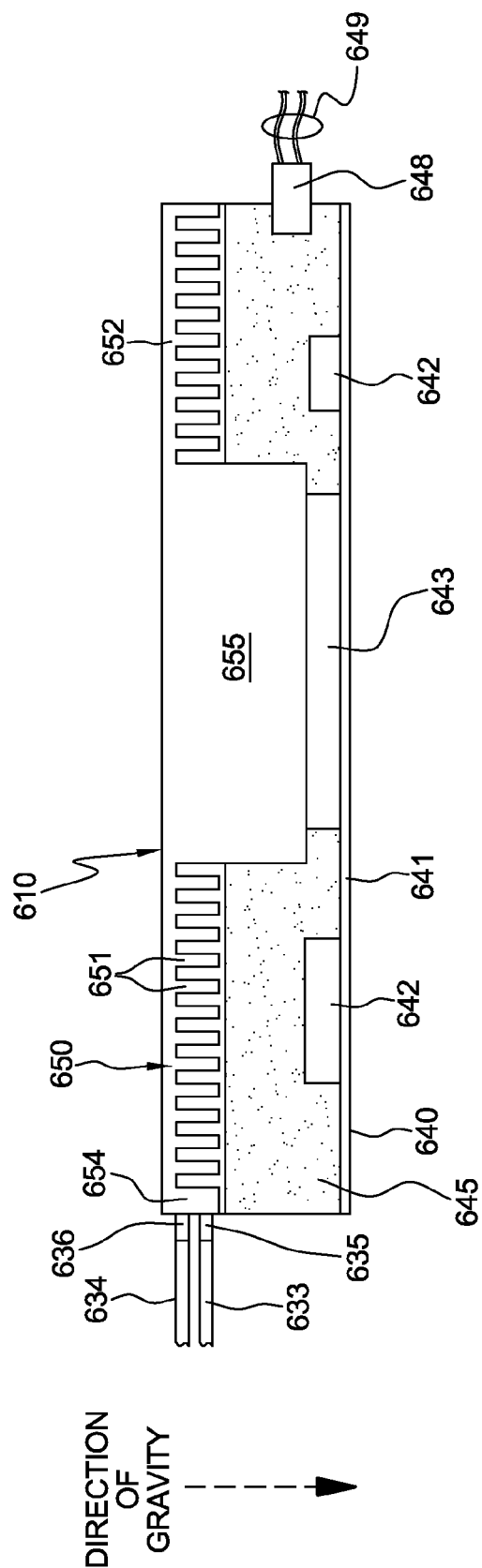
FIG. 6B is a cross-sectional elevational view of one immersion-cooled electronic subsystem of the liquid-cooled electronics rack of FIG. 6A, in accordance with one or more aspects of the present invention.

As illustrated in FIG. 6B, electronic subsystem 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic subsystem with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651, 655 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cool condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

In practice, a vapor-condenser may lack the capacity to remove all the heat dissipated by the components, resulting in more vapor being generated, raising the pressure in the immersion-cooled enclosure and potentially (detrimentally) raising the saturation temperature. Disclosed hereinbelow are various cooling apparatuses and methods of cooling which provide controlled, thermoelectric-enhanced, vapor-condensing to facilitate immersion-cooling of electronic components. Since the use of thermoelectric cooling is selective and controlled, additional cooling can be provided only when required, that is, when most needed, while still maintaining improved overall energy consumption of an immersion-cooling approach.

Generally stated, provided herein are various embodiments of cooling apparatuses which include a housing at least partially surrounding and forming a fluid-tight compartment about at least one electronic component to be cooled, and a dielectric fluid disposed within the fluid-tight compartment. The at least one electronic component to be cooled is immersed within the dielectric fluid. The cooling apparatus further includes a vapor-condenser, a heat sink, and a thermal conduction path. The vapor-condenser includes a plurality of thermally conductive condenser fins extending within the fluid-tight compartment, and the heat sink includes a first region and a second region. The first region of the heat sink is coupled in thermal contact with the vapor-condenser to facilitate cooling of the vapor-condenser, and the thermal conduction path couples the fluid-tight compartment and the second region of the heat sink in thermal contact. The thermal conduction path, which is in addition to the direct thermal conduction path from the vapor-condenser to the first region of the heat sink, includes a thermoelectric array with at least one thermoelectric module. The thermoelectric array facilitates selective controlled transfer of heat from the fluid-tight compartment to the second region of the heat sink. Thus, auxiliary cooling of the vapor-condenser (or fluid-tight compartment) can be provided by selectively activating the thermoelectric array in the thermal conduction path.

More particularly, disclosed herein are cooling apparatuses that dissipate heat generated by electronics to be cooled through the use of a dielectric fluid, and one or more thermoelectric-enhanced, vapor-condensers which facilitate heat transfer to a secondary fluid stream, such as air or water. The cooling apparatus includes one or more electronic components to be cooled mounted within a fluid-tight (or sealed) enclosure, and at least partially filled with dielectric coolant. The dielectric coolant transports heat from the electronics via boiling and condensation to a cooling structure (herein referred to as the vapor-condenser) extending within the fluid-tight compartment. The vapor-condenser includes fins extending within the fluid-tight compartment that are thermally coupled to a heat sink (i.e., external cooling structure), whether air or liquid-cooled, such that when the electronic component(s) dissipates a low-power heat, it may be dissipated through the dielectric coolant, to the condenser, and then directly to the heat sink. The cooling apparatus further includes an enhanced thermal conduction path with one or more thermoelectric arrays comprising one or more thermoelectric modules. In one embodiment, the cold side of the thermoelectric module(s), which comprises one or more thermoelectric elements, is coupled to the condenser, and the hot side is coupled to the heat sink.

Note that the thermal conduction path comprising the thermoelectric array of one or more thermoelectric module(s) is distinct from the direct thermal conduction path between the condenser and the heat sink (which may be in direct contact across a thermal interface material). Thus, when a threshold temperature associated with the electronic component to be cooled is reached, the thermoelectric array (or thermoelectric modules) may be supplied current to decrease the temperature, and thus increase the cooling capacity of the condensing or cooling structure.

Figure 7A:
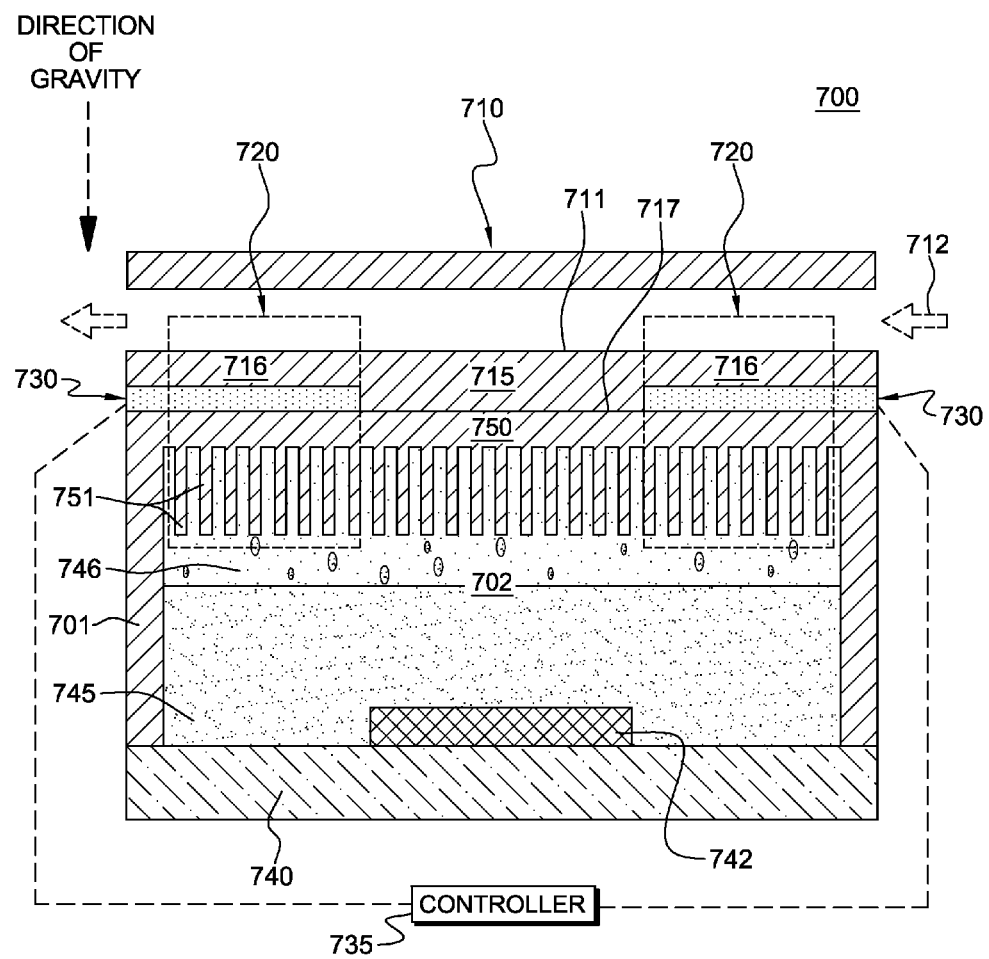
FIG. 7A is a cross-sectional elevational view of an alternate embodiment of an immersion-cooled electronic subsystem (or component) of, for example, a liquid-cooled electronics rack such as depicted in FIG. 6A, in accordance with one or more aspects of the present invention.

FIG. 7A is a cross-sectional elevational view of one embodiment of a cooling apparatus, generally denoted 700, in accordance with this aspect of the present invention. In one embodiment, cooling apparatus 700 may be configured to accommodate an electronic subsystem (or node) of an electronics rack, such as described above in connection with FIGS. 6A & 6B. In such an embodiment, a rack-level inlet manifold and rack-level outlet manifold would facilitate distribution of a liquid coolant 712 among the liquid-cooled structures associated with the electronic subsystems of the electronics rack. Further, depending upon the implementation, there may be a single cooling apparatus 700 within an electronic subsystem cooling, for example, substantially the entire electronic subsystem, or multiple cooling apparatuses may be disposed within the electronic subsystem, for example, to cool multiple high-heat-generating electronic components thereof. As illustrated, cooling apparatus 700 includes a heat sink 710, which in this embodiment is a liquid-cooled structure comprising one or more coolant-carrying channels 711 through which secondary liquid coolant 712 flows to facilitate extraction of heat from the immersion-cooling enclosure 701.

As depicted in FIG. 7A, immersion-cooling enclosure 701 at least partially surrounds one or more electronic components 742, and in this example, mounts to a substrate 740, such as a printed circuit board, to which the one or more electronic components 742 are mounted. Within immersion-cooling enclosure 701, a fluid-tight compartment 702 is defined which includes a dielectric coolant 745 that at least partially fills fluid-tight compartment 702. In the depicted embodiment, a portion of dielectric coolant 745 is illustrated in vapor phase 746 in an upper region of fluid-tight compartment 702. Also disposed in the upper region of fluid-tight compartment 702 is a vapor-condenser 750 with a plurality of thermally conductive condenser fins 751 extending within fluid-tight compartment 702.

In the embodiment depicted, heat sink 710 and vapor-condenser 750 are in thermal contact across a thermal interface material 717 in a first region 715 of heat sink 710, and one or more indirect thermal conduction paths 720 are provided from fluid-tight chamber 702 to one or more second regions 716 of heat sink 710, and hence, to the liquid coolant 712 flowing through the one or more coolant-carrying channels 711. In this embodiment, each thermal conduction path 720 includes one or more of the thermally conductive condenser fins 751 of vapor-condenser 750, one or more thermoelectric arrays (comprising one or more thermoelectric modules) 730, and a respective second region 716. Note that second region 716 may be a single, continuous second region of heat sink 710, or multiple, discrete second regions of heat sink 710. In the embodiment illustrated, first region 715 of heat sink 710 is substantially aligned over the one or more electronic components 742 to be cooled, which facilitates a low-power mode cooling of the one or more electronic components without the use of the thermoelectric array(s) 730.

Activation and operation of the thermoelectric array(s) 730 is controlled, in the depicted embodiment, by a controller 735, which may reside within the associated electronic subsystem, or elsewhere, for example, within the electronics rack or the data center. Controller 735 may be coupled to one or more temperature sensors (not shown) associated with the electronic component(s) 742 to be cooled. By way of example, the one or more temperature sensors might reside on a surface of the electronic component, or be integrated with the electronic component, or reside within the fluid-tight compartment 702, e.g., on substrate 740 in the vicinity of the one or more electronic components to be cooled. Controller 735 is coupled to a power source (not shown) for each thermoelectric array 730 to control activation/deactivation of the thermoelectric array, as well as (in one embodiment) an amount of power provided to the thermoelectric array, and thus the amount of heat actively transferred by the thermoelectric array, which corresponds to the amount of heat transferred through the respective indirect thermal conduction path 720.

Note that in one specific example, the heat sink is integrated with the vapor-condenser, and comprises a cold plate with a fin-type condenser that includes a copper tube fitted into a mating notch on the cold plate, with thermal epoxy or solder providing the thermal interface material. Fins are machined on the opposing side of the cold plate using, for example, EDM, end-milling or gang-sawing. Condenser fluid from the modular cooling unit, or a separate coolant distribution unit within the data center, may be pumped through the rack inlet manifold and distributed among the electronic subsystems (or nodes) of the electronics racks. Note further that the one or more electronic components to be cooled are mounted within a fluid-tight (or sealed) container that has been evacuated and back-filled with dielectric coolant (e.g., fluorocarbon, HFE, etc.). In the case of a dielectric refrigerant, as the electronics generate heat and the dielectric coolant boils on the surface of the electronics, vapor bubbles rise to the condenser fins. The condenser fins are thermally coupled to or integrated, in this embodiment, with a liquid-cooled heat sink, such that a portion of the condenser fins are cooled directly by the liquid-cooled heat sink. The dielectric vapor condenses on the condenser surfaces, and the resulting droplets drop down in the direction of gravity towards the one or more electronic components. Further, the condensing fins are thermally coupled to the respective cold sides of the one or more thermoelectric modules such that when an electrical current is applied to the thermoelectric modules, additional heat is pumped via the thermoelectric modules from the condenser fins to the liquid-cooled heat sink, which is coupled to the hot side of the one or more thermoelectric arrays or modules.

Figure 7B:
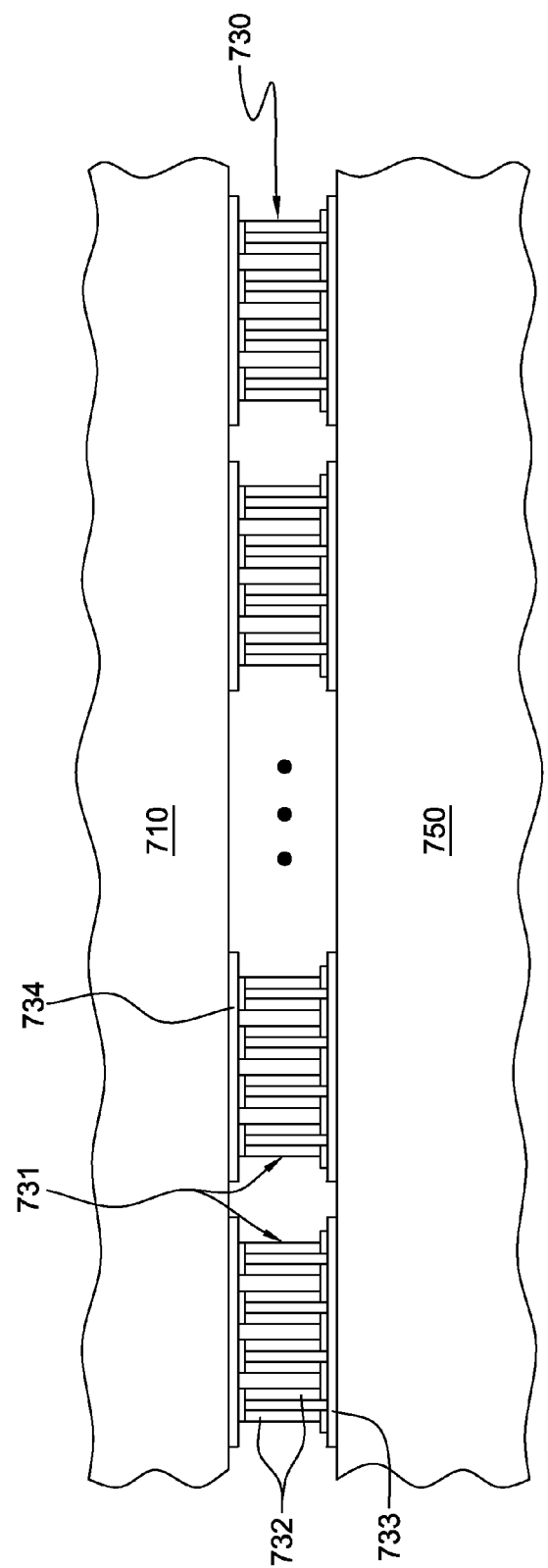
FIG. 7B is a partial, cross-sectional elevational view of one embodiment of the thermoelectric-array of FIG. 7A facilitating controlled transfer of heat through one or more thermal conduction paths of the immersion-cooled electronic subsystem (or component), in accordance with one or more aspects of the present invention.

FIG. 7B is a cross-sectional elevational view of one embodiment of thermoelectric-enhanced transfer of heat from a surface of a vapor-condenser 750 to a liquid-cooled heat sink 710, which (in this example) is directly coupled to a hot side 734 of the thermoelectric array. The thermoelectric array comprises a plurality of thermoelectric modules 731, each of which comprises individual thermoelectric elements 732. In this example, the cold side 733 of the thermoelectric array is coupled to vapor-condenser 750, and the hot side 734 of the thermoelectric array is coupled to the liquid-cooled heat sink 710.

The use of multiple thermoelectric cooling elements within a module is known. These elements operate electronically to produce a cooling effect. By passing a direct current through the elements of a thermoelectric device, a heat flow is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the thermoelectric module.

By way of specific example, thermoelectric modules 731 may comprise TEC CP-2-127-06L modules, offered by Melcor Laird, of Cleveland, Ohio.

Note that the thermoelectric array may comprise any number of thermoelectric modules, including one or more modules, and is dependent (in part) on the size of the electronic modules, as well as the amount of heat to be transferred to coolant flowing through liquid-cooled heat sink 710. Also note that an insulative material (not shown) may be provided over one or more of the exposed surfaces of the thermal conduction path or liquid-cooled structure.

The thermoelectric (TE) array may comprise a planar thermoelectric array with modules arranged in a square or rectangular array. Although the wiring is not shown, each thermoelectric module in a column may be wired and supplied electric current (I) in series and the columns of thermoelectric modules may be electrically wired in parallel so that the total current supplied would be I×sqrt(M) for a square array comprising M thermoelectric modules, providing an appreciation of the inherent scalability of the array. In this way, if a single thermoelectric module should fail, only one column is effected, and electric current to the remaining columns may be increased to compensate for the failure.

Table 1 provides an example of the scalability provided by a planar thermoelectric heat exchanger configuration such as described herein.

TABLE 1

| Number of TE Modules (M) | Array Size |
|---|---|
| 81 | 585 mm × 585 mm (23.0 in. × 23.0 in.) |
| 100 | 650 mm × 650 mm (25.6 in. × 25.6 in.) |
| 121 | 715 mm × 715 mm (28.2 in. × 28.2 in.) |
| 144 | 780 mm × 780 mm (30.7 in. × 30.7 in.) |
| 169 | 845 mm × 845 mm (33.3 in. × 33.3 in.) |

For a fixed electric current and temperature difference across the thermoelectric modules, the heat pumped by the thermoelectric array will scale with the number of thermoelectric modules in the planform area. Thus, the heat load capability of a 650 mm×650 mm thermoelectric heat exchanger will be 1.23 times that of a 585 mm×585 mm thermoelectric heat exchanger, and that of an 845 mm×845 mm will be 2.09 times greater. If the space available for the thermoelectric heat exchanger is constrained in the X×Y dimensions, then the heat pumping capabilities can still be scaled upwards by growing in the Z dimension. This can be done by utilizing multiple layers of thermoelectric modules between multiple heat exchange elements, with alternating hot and cold sides, as described in the above-referenced U.S. Pat. No. 6,557,354 B1.

FIG. 7C is a cross-sectional elevational view of an alternate embodiment of cooling apparatus 700' similar to cooling apparatus 700 described above in connection with FIGS. 7A & 7B. In this embodiment, however, the liquid-cooled heat sink 710 of FIG. 7A is replaced with an air-cooled heat sink 710'. Air-cooled heat sink 710' is a thermally conductive structure which includes a plurality of thermally conductive air-cooled fins 718 extending, for example, from vapor-condenser 750 within first region 715 of heat sink 710' and extending from a base structure within second region 716 of air-cooled heat sink 710'. By directly coupling air-cooled fins 718 to vapor-condenser 750 within first region 715, enhanced heat transfer is provided in a first, low-power cooling mode as described herein, where the thermoelectric arrays (or modules) 730 are deactivated. The low-power cooling mode may be particularly advantageously employed when, for example, the one or more electronic components 742 are in a standby mode or otherwise dissipating a low amount of heat. Note that, as illustrated in FIG. 7C, the thermally conductive air-cooled fins 718 within first region 715 are spaced from the base structure within second region 716 of air-cooled heat sink 710' coupled to the thermoelectric array(s) 730.

Figure 7D:
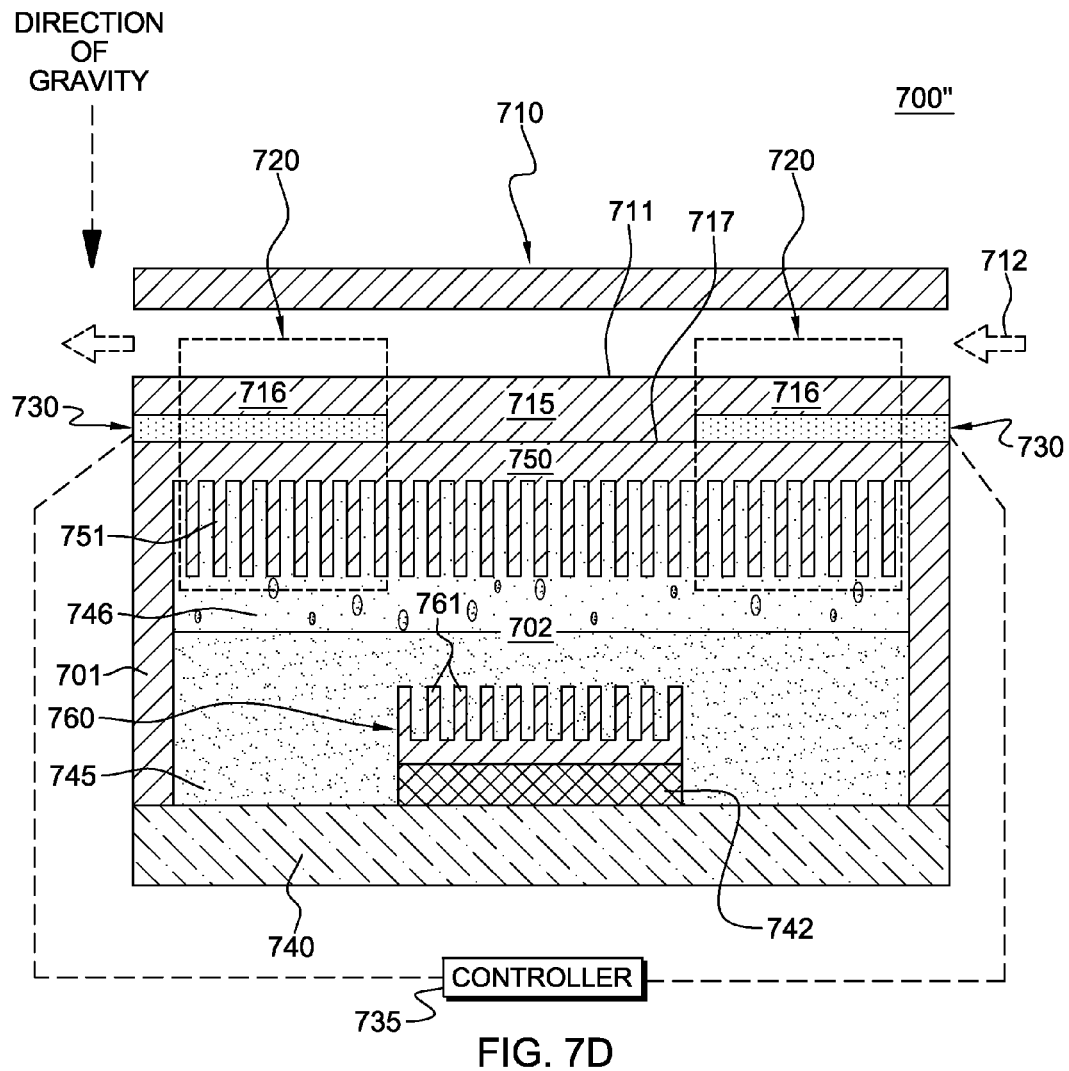
FIG. 7D is a partial cross-sectional elevational view of another alternate embodiment of an immersion-cooled electronic subsystem (or component), in accordance with one or more aspects of the present invention.

FIG. 7D depicts a further alternate embodiment of a cooling apparatus 700", in accordance with one or more aspects of the present invention. Cooling apparatus 700" is similar to cooling apparatus 700 described above in connection with FIGS. 7A & 7B, with the addition of a heat spreader 760 coupled to one or more surfaces of the electronic component(s) 742 to be cooled. Heat spreader 760, which includes (in the depicted embodiment) multiple fluid-boiling fins 761 extending therefrom within fluid-tight compartment 702, may be any enhanced surface provided to the electronic component to be cooled in order to decrease the heat flux into the dielectric coolant, thereby increasing the total power dissipation capability of the cooling apparatus. This heat spreader (or enhanced surface) may be any of a sintered powdered metal coating, pin fins, plate fins, roughened spreader, metal foam, or other extended surface which increases the wetted area thermally coupled to the electronic component to be cooled.

Figure 7E:
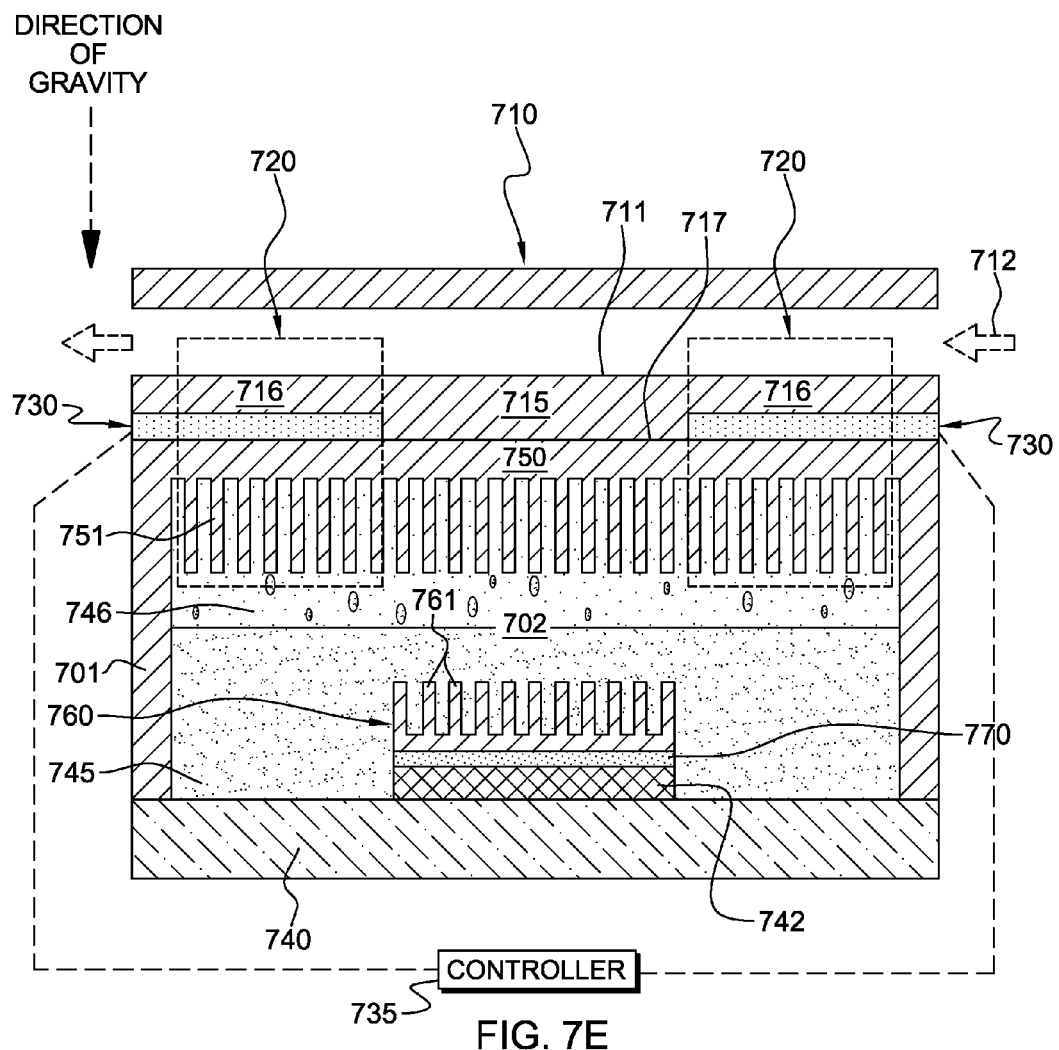
FIG. 7E is a partial cross-sectional elevational view of another alternate embodiment of an immersion-cooled electronic subsystem (or component), in accordance with one or more aspects of the present invention.

FIG. 7E depicts the cooling apparatus 700" of FIG. 7D with the addition of a second thermoelectric array 770 between the one or more electronic components 742 to be cooled and heat spreader 760. In this embodiment, the cold side of the second thermoelectric array 770 is coupled to the one or more electronic components 742 to be cooled, and the hot side is coupled to heat spreader 760. This arrangement serves to allow immediate, controlled reaction to an increased thermal load within the electronic component, and could serve to make the system more fault-tolerant in a case where a non-condensable liquid were to leak into the compartment 702 or the heat sink 710 were to display reduced cooling performance.

Figure 7F:
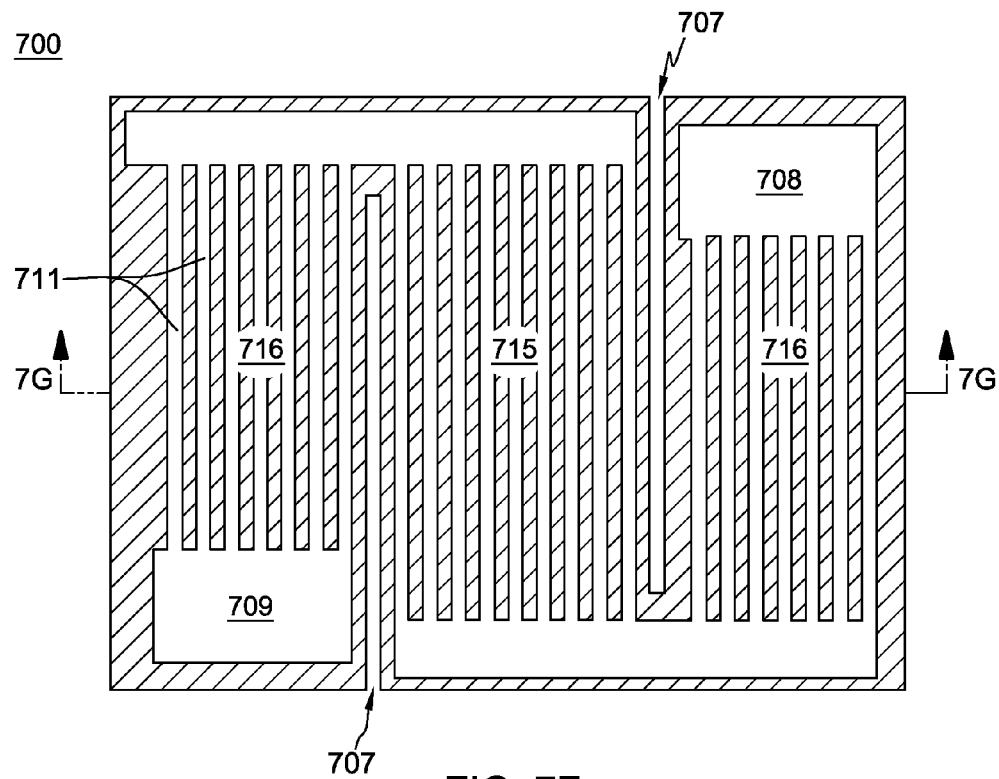
FIG. 7F is a cross-sectional plan view of one embodiment of another alternate embodiment of an immersion-cooled electronic subsystem (or component), taken along line 7F-7F in FIG. 7G, in accordance with one or more aspects of the present invention.
Figure 7G:
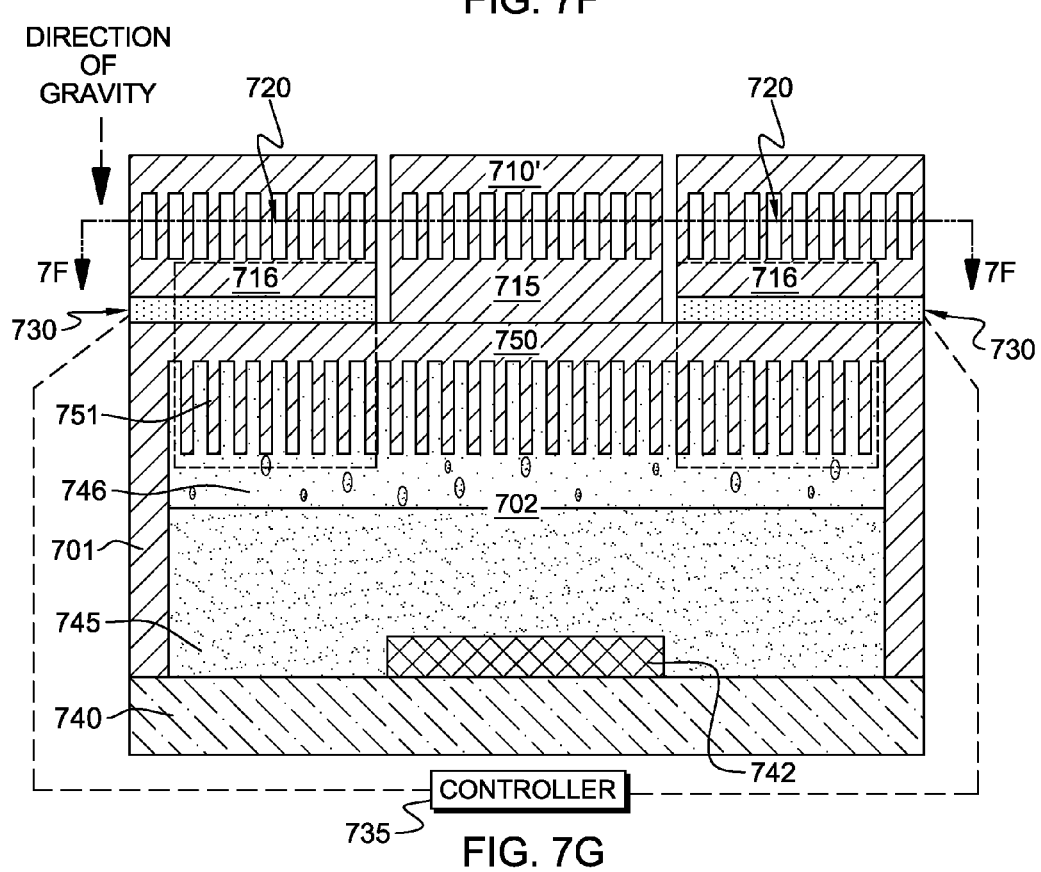
FIG. 7G is a partial cross-sectional elevational view of the immersion-cooled electronic subsystem (or component) of FIG. 7F, taken along line 7G-7G thereof, in accordance with one or more aspects of the present invention.

FIGS. 7F & 7G depict a further variation on the cooling apparatus 700 described above in connection with FIGS. 7A & 7B. In this embodiment, the heat sink 710' is configured with one or more conduction gaps 707 that serve to partially isolate first region 715 of heat sink 710' and second regions 716 of heat sink 710. In particular, conduction gaps 707 prevent direct transfer of heat through heat sink 710 from the hot side of the thermoelectric array(s) 730 to the cold side of the thermoelectric array(s) 730. Coolant (FIG. 7A) enters heat sink 710' via a coolant inlet plenum 708, and exhausts via a coolant outlet plenum 709 after passing through multiple parallel-disposed, coolant-carrying channels 711 within the second regions 716 and first region 715 of heat sink 710'.

Figure 8A:
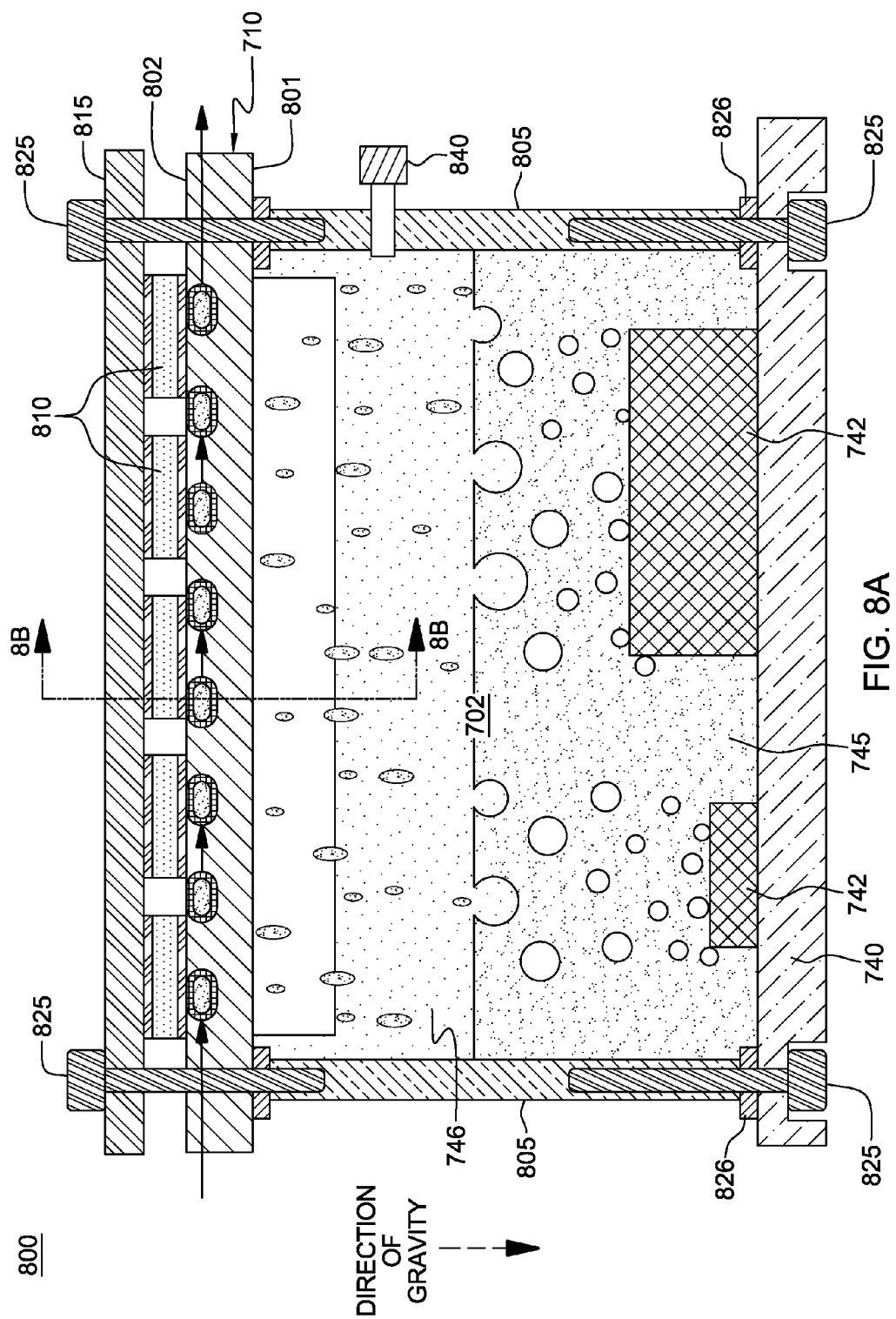
FIG. 8A is a partial cross-sectional elevational view of another embodiment of an immersion-cooled electronic subsystem, in accordance with one or more aspects of the present invention.
Figure 8B:
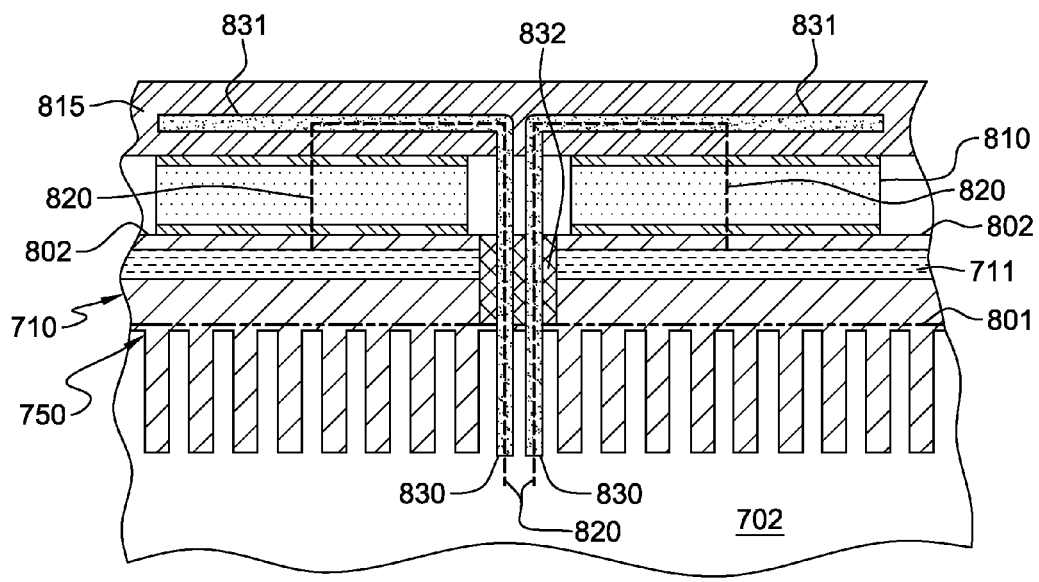
FIG. 8B is a partial cross-sectional elevational view, taken along line 8B-8B of FIG. 8A, in accordance with one or more aspects of the present invention.

FIGS. 8A & 8B depict another embodiment of a cooling apparatus 800, in accordance with one or more aspects of the present invention. Referring collectively to FIGS. 8A & 8B, the cooling apparatus 800 is similar to the cooling apparatuses described above in connection with FIGS. 7A-7G, however, the thermal conduction paths 820 are differently configured. In this embodiment, heat sink 710 is a liquid-cooled heat sink comprising a lower side 801 and an upper side 802, with vapor-condenser 750 being coupled to lower side 801 of liquid-cooled heat sink 710. Liquid-cooled heat sink 710 includes one or more coolant-carrying channels 711 disposed within the heat sink, through which liquid coolant flows to facilitate extraction of heat from the immersion-cooling structure. A thermoelectric array (comprising a plurality of thermoelectric modules) 810 is coupled to and disposed between upper surface 802 of liquid-cooled heat sink 710, and a heat spreader 815, which may comprise (in one example) a thermally conductive plate. Note that in this example, the lower surface 801 and upper surface 802 reside at or comprise the first region and the second region, respectively, of the liquid-cooled heat sink 710.

Multiple indirect thermal transfer paths 820 are illustrated in FIG. 8B, each of which includes at least one heat pipe 830 extending from within fluid-tight compartment 702 into heat spreader 815. More particularly, and as illustrated, a first heat pipe section 831 of each heat pipe 830 is disposed within heat spreader 815 substantially parallel to, for example, upper surface 802 of liquid-cooled heat sink 710. In one embodiment, the cold side of thermoelectric array(s) 810 is disposed adjacent to heat spreader 815, and the hot side is disposed adjacent to upper surface 802 of heat sink 710. An insulated boss 832 may be provided extending through heat sink 710 to isolate passage of heat pipes 830 through the heat sink and into heat spreader 815.

In the depicted embodiment, each thermal conduction path 820 extends upwards through a respective heat pipe 830, over and then downward through heat spreader 815, a respective thermoelectric array (or module) 810, across upper surface 802 (i.e., the second region) of heat sink 710 into, for example, one or more coolant-carrying channels 711 of the heat sink. Thermal epoxy, thermal grease or indium layers may be used as the thermal interface material(s) between the thermoelectric array(s) (or module(s)) and the heat sink and heat spreader plate. The embedded heat pipes 830 pass through insulated boss 832 in the heat sink, and are suspended as fins within the fluid-tight compartment 702. Heat pipes 830 provide (in this embodiment) a low thermal resistance path to the cold side of the thermoelectric modules. As is well known, a heat pipe may comprise a hollow structure that allows heat to migrate from one end of the structure to another via a flow of vapor, and provides a return of liquid condensate under the action of capillary force via a wick or screen-like matrix. A high concentration of vapor may exist closer to the heat source, with a lower concentration of vapor at the condenser end of the heat pipe. The result is a mass flow from one end to the other end of the member, taking advantage of the latent heat of vaporization of the fluid, thereby allowing the vapor to transport heat from one end to the other. In one embodiment, the heat pipes employed herein may be cylindrical-shaped heat pipes.

Note that the housing in this embodiment comprises substrate 740, side walls 805, and heat sink 710, with mechanical means 825 (e.g., screws) and sealing gaskets 826 being provided to couple the components together and define the fluid-tight compartment 702 within which the electronic component(s) to be cooled is immersed in the dielectric coolant. Note also that, in this embodiment, multiple differently-sized electronic components 742 are illustrated by way of example. The electronic components 742 to be cooled may comprise the same or different types of electronic components, and as one example, the housing may accommodate an entire electronic subsystem (or node) of an electronics rack, such as described above in connection with FIGS. 6A & 6B. A sealable fill port 840 may be provided in a side wall 805 to facilitate immersing the one or more electronic components 742 within liquid dielectric coolant 745.

In operation, heat from the electronic components causes the dielectric fluid 745 to boil and produce vapor 746. The vapor rises through the fluid and into the vapor space above the fluid. The hot vapor then condenses on the cooled condenser fins. During low-load operation, the thermoelectric modules attached to the upper side 802 of heat sink 710 are deactivated, since the rate of condensation of vapor is equal or higher than the rate of evaporation, and further condensation enhancement is unnecessary to maintain the saturation pressure and temperature in the enclosure, and provide the necessary cooling to the electronic components. In this mode, the suspended heat pipes 820 do not participate significantly in the heat removal process due to the poor thermal conduction of the thermoelectric array 810 when deactivated or unpowered. As the heat load is increased, the rate of boiling increases until it exceeds the rate of heat removal capable with the first region of liquid-cooled heat sink and the vapor-condenser fin structures 751. As the pressure in the fluid-tight compartment rises, the saturation temperature increases. Temperature sensors (not shown) embedded on the substrate or the electronic components (e.g., microprocessors) may be used to track this change in temperature, and once a set limit is reached, the thermoelectric arrays or modules 810 may be activated. Alternatively, the electronic component workload could be monitored to ascertain and signal the need for enhanced thermoelectric cooling. Upon activation of the thermoelectric arrays 810, the suspended heat pipes 830 provide a boost in condenser performance by increasing the heat removal through the thermal conduction paths 820 to the non-finned, second (upper) side 802 of heat sink 710. The additional heat removal via the heat pipes 830 and thermoelectric arrays 810 facilitates maintaining the cooling performance of the immersion-cooled electronic components by maintaining the saturation pressure and temperature within the compartment within a prescribed operational range.

Note that in the embodiment of FIGS. 8A & 8B, the heat sink and vapor-condenser may comprise separate structures that are coupled (e.g., attached) to each other with a thermal epoxy or other suitable thermal interface material. Further, note that the heat sink (e.g., liquid-cooled cold plate) may have precut notches, into which the heat pipes 830 are bent. Attachment of the vapor-condenser then holds the heat pipes 830 in place within the notches.

Figure 9:
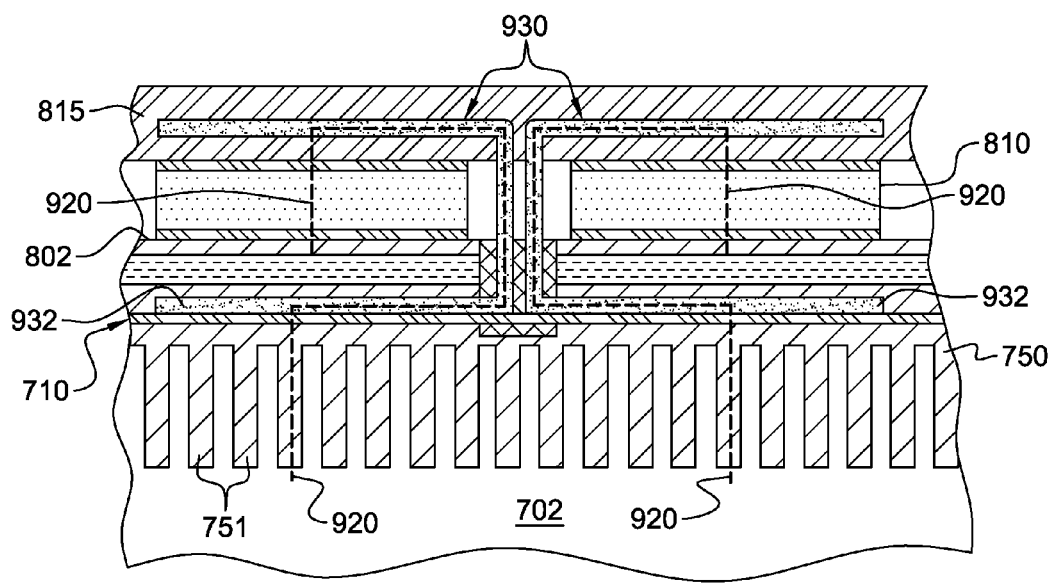
FIG. 9 is a partial cross-sectional elevational view of another embodiment of the immersion-cooled electronic subsystem of FIG. 8A, in accordance with one or more aspects of the present invention.

FIG. 9 depicts an alternate embodiment to the heat pipe configuration of FIG. 8B, for use with the cooling apparatus of FIG. 8A. In this alternate embodiment, the thermal conduction paths 920 are upward through one or more condenser fins 751 of vapor-condenser 750, into a respective heat pipe 930, then through heat spreader 815 and a respective thermoelectric array (or module) 810 for passage via upper surface 802 (i.e., the second region) into liquid-cooled heat sink 710. One approach to fabricating the structure of FIG. 9 would be to bend the heat pipes 930 into precut notches in, for example, heat spreader 815, as well as at least one of the liquid-cooled heat sink 710 or the vapor-condenser 750. Note that in this implementation, the vapor-condenser and heat sink might comprise a unitary structure, thereby improving conduction between the thermally conductive condenser fins 751 and the one or more coolant-carrying channels 711 of the heat sink portion of the structure.

In operation, during low workload situations, the heat pipes 930 and thermoelectric arrays or modules 810 do not participate significantly in heat transfer, since the thermoelectric modules are deactivated. When the thermoelectric modules are activated, for example, upon detection of increasing saturation temperature or increasing electronic component workload, the embedded heat pipes 930 increase the heat transfer between a majority, if not all, of the thermally conductive condenser fins 751 in the vicinity of the embedded second heat pipe section 932 and the fluid-tight chamber 702. This allows for a larger number of fins to have a boosted heat removable capability, that is, compared with the embodiment of FIG. 8B, where only the suspended heat pipe fins would see an increase in heat removal capability with activation of the respective thermoelectric array. The additional heat removal via the heat pipes and thermoelectric modules facilitates maintaining the cooling performance of the immersion-cooled structure within, for example, a prescribed operational range.

Those skilled in the art will note from the above description that provided herein is a novel cooling apparatus and method of immersion-cooling one or more electronic components. Different thermal transfer paths are provided between, for example, a fluid-tight compartment and a heat sink to which heat generated within the immersion-cooled structure is rejected. In a first heat transfer path, heat is transferred from one or more thermally conductive condenser fins of a vapor-condenser into a first region of the heat sink in thermal contact with the vapor-condenser. In a second heat transfer path, a thermal conduction path is provided coupling the fluid-tight compartment and a second region of the heat sink in thermal contact. This thermal conduction path includes one or more thermoelectric arrays comprising one or more thermoelectric modules which facilitates controlled, active transfer of heat from the fluid-tight compartment to the second region of the heat sink.

The cooling structures provided herein preserve the advantages of immersion-cooling over, for example, pumped, single-phase, liquid-cooling, despite limitations on the total heat transfer on the condenser side of a heat sink. Advantages of immersion-cooling include an improved temperature uniformity across the components, a lower required flow rate of the secondary fluid, and the potential for warm water-cooling. The later advantage would further improve energy efficiency, and enable the use of economizers. In addition, the cooling structures provided herein selectively provide additional cooling capability at higher workloads, when heat dissipation requirements are higher. Attaching thermoelectric modules (for example, on the opposing side of the heat sink, with thermal communication via heat pipes) facilitates increasing the total heat transfer area compared with, for example, a single-sided, finned heat sink and vapor-condenser structure. Further, by attaching the thermoelectric modules on the second surface of the heat sink, the low thermally conductive thermoelectric module (when deactivated) is removed from the direct heat transfer path during times when the thermoelectric module is unneeded. This can improve heat transfer during normal low-power workloads, and can delay the point at which the thermoelectric module(s) needs to be activated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
    a housing at least partially surrounding and forming a fluid-tight compartment about at least one electronic component to be cooled;
    a dielectric fluid disposed within the fluid-tight compartment, wherein the at least one electronic component to be cooled is immersed within the dielectric fluid;
    a vapor-condenser comprising a plurality of thermally conductive condenser fins extending within the fluid-tight compartment;
    a heat sink comprising a first region and a second region, the first region of the heat sink being in thermal contact with the vapor-condenser; and
    a thermal conduction path coupling the fluid-tight compartment and the second region of the heat sink in thermal contact, the thermal conduction path comprising a thermoelectric array including at least one thermoelectric module, the thermoelectric array facilitating controlled transfer of heat from the fluid-tight compartment to the second region of the heat sink through the thermal conduction path.

2. The cooling apparatus of claim 1, wherein the first region of the heat sink is coupled to the vapor-condenser, and aligns over the at least one electronic component to be cooled.

3. The cooling apparatus of claim 1, wherein the thermal conduction path comprises a portion of the vapor-condenser, and the thermoelectric array is coupled to and disposed between the portion of the vapor-condenser and the second region of the heat sink.

4. The cooling apparatus of claim 1, wherein the first region of the heat sink aligns over the at least one electronic component to be cooled, and wherein the cooling apparatus further comprises at least one heat spreader coupled to the at least one electronic component to be cooled, the at least one heat spreader comprising multiple fluid-boiling fins extending therefrom within the fluid-tight compartment.

5. The cooling apparatus of claim 4, wherein the thermoelectric array comprises a first thermoelectric array, and wherein the cooling apparatus further comprises a second thermoelectric array, the second thermoelectric array being coupled to and disposed between the at least one electronic component to be cooled and the at least one heat spreader comprising the multiple fluid-boiling fins extending therefrom within the fluid-tight compartment.

6. The cooling apparatus of claim 1, wherein the heat sink comprises at least two regions at least partially spaced apart, the at least two regions comprising the first region and the second region, and wherein the first region aligns over the at least one electronic component to be cooled, and the second region is offset from the at least one electronic component to be cooled.

7. The cooling apparatus of claim 1, wherein the first region comprises a first side of the heat sink and the second region comprises a second side of the heat sink, the first side and the second side being opposing sides of the heat sink, and wherein the heat sink is a liquid-cooled heat sink.

8. The cooling apparatus of claim 7, wherein the thermal conduction path further comprises a thermal spreader and at least one heat pipe, the at least one heat pipe comprising a first heat pipe section residing within the thermal spreader, and the thermoelectric array being coupled to and disposed between the thermal spreader and the second region of the heat sink.

9. The cooling apparatus of claim 8, wherein the at least one heat pipe extends into the fluid-tight compartment and facilitates conduction of heat from the fluid-tight compartment into the heat spreader.

10. The cooling apparatus of claim 8, wherein the at least one heat pipe further comprises a second heat pipe section residing within at least one of the heat sink or the vapor-condenser and extending in a direction substantially parallel to the first heat pipe section disposed within the thermal spreader.

11. The cooling apparatus of claim 1, further comprising a controller coupled to control operation of the thermoelectric array, the controller operating the thermoelectric array in one of a first cooling mode or a second cooling mode, wherein in the first cooling mode, the thermoelectric array is deactivated and the vapor-condenser is cooled via the first region of the heat sink being in thermal contact therewith, and in the second cooling mode, the thermoelectric array is energized and actively transferring heat thereacross, and the vapor-condenser is cooled via the first region of the heat sink being in thermal contact therewith and via transfer of heat through the thermal conduction path from the fluid-tight compartment to the second region of the heat sink.

12. A liquid-cooled electronic system comprising:
an electronics rack comprising at least one electronic component to be cooled; and
a cooling apparatus configured to immersion-cool the at least one electronic component, the cooling apparatus comprising:
 a housing at least partially surrounding and forming a fluid-tight compartment about the at least one electronic component to be cooled;
 a dielectric fluid disposed within the fluid-tight compartment, wherein the at least one electronic component to be cooled is immersed within the dielectric fluid;
 a vapor-condenser comprising a plurality of thermally conductive condenser fins extending within the fluid-tight compartment;
 a heat sink comprising a first region and a second region, the first region of the heat sink being in thermal contact with the vapor-condenser; and
 a thermal conduction path coupling the fluid-tight compartment and the second region of the heat sink in thermal contact, the thermal conduction path comprising a thermoelectric array including at least one thermoelectric module, the thermoelectric array facilitating controlled transfer of heat from the fluid-tight compartment to the second region of the heat sink through the thermal conduction path.

13. The liquid-cooled electronic system of claim 12, wherein the first region of the heat sink is coupled to the vapor-condenser, and aligns over the at least one electronic component to be cooled.

14. The liquid-cooled electronic system of claim 12, wherein the first region of the heat sink aligns over the at least one electronic component to be cooled, and wherein the cooling apparatus further comprises at least one heat spreader coupled to the at least one electronic component to be cooled, the at least one heat spreader comprising multiple fluid-boiling fins extending therefrom within the fluid-tight compartment.

15. The liquid-cooled electronic system of claim 12, wherein the first region comprises a first side of the heat sink and the second region comprises a second side of the heat sink, the first side and the second side being opposing sides of the heat sink, and wherein the heat sink is a liquid-cooled heat sink.

16. The liquid-cooled electronic system of claim 15, wherein the thermal conduction path further comprises a thermal spreader and at least one heat pipe, the at least one heat pipe comprising a first heat pipe section residing within the thermal spreader, and the thermoelectric array being coupled to and disposed between the thermal spreader and the second region of the heat sink.

17. The liquid-cooled electronic system of claim 16, wherein the at least one heat pipe extends into the fluid-tight compartment and facilitates conduction of heat from the fluid-tight compartment into the heat spreader.

18. The liquid-cooled electronic system of claim 16, wherein the at least one heat pipe further comprises a second heat pipe section residing within at least one of the heat sink or the vapor-condenser and extending in a direction substantially parallel to the first heat pipe section disposed within the thermal spreader.

19. The liquid-cooled electronic system of claim 12, further comprising a controller coupled to control operation of the thermoelectric array, the controller operating the thermoelectric array in one of a first cooling mode or a second cooling mode, wherein in the first cooling mode, the thermoelectric array is deactivated and the vapor-condenser is cooled via the first region of the heat sink being in thermal contact therewith, and in the second cooling mode, the thermoelectric array is energized and actively transferring heat thereacross, and the vapor-condenser is cooled via the first region of the heat sink being in thermal contact therewith and via transfer of heat through the thermal conduction path from the fluid-tight compartment to the second region of the heat sink.

20. A method of facilitating cooling of at least one electronic component, the method comprising:
providing a housing at least partially surrounding and forming a fluid-tight compartment about the at least one electronic component to be cooled;
immersing the at least one electronic component within a dielectric fluid within the fluid-tight compartment;
providing a vapor-condenser comprising a plurality of thermally conductive condenser fins extending into the fluid-tight compartment;
providing a heat sink comprising a first region and a second region, the first region of the heat sink being in thermal contact with the vapor-condenser; and
providing a thermal conduction path coupling the fluid-tight compartment and the second region of the heat sink in thermal contact, the thermal conduction path comprising a thermoelectric array including at least one thermoelectric module, the thermoelectric array facilitating transfer of heat from the fluid-tight compartment to the second region of the heat sink through the thermal conduction path.

* * * * *